(12) United States Patent
Padmanaban et al.

(10) Patent No.: US 8,796,398 B2
(45) Date of Patent: Aug. 5, 2014

(54) SUPERFINE PATTERN MASK, METHOD FOR PRODUCTION THEREOF, AND METHOD EMPLOYING THE SAME FOR FORMING SUPERFINE PATTERN

(75) Inventors: Munirathna Padmanaban, Bridgewater, NJ (US); Jin Li, Shizuoka (JP); Toru Koike, Shizuoka (JP); Yusuke Takano, Shizuoka (JP); Kazunori Kurosawa, Shizuoka (JP)

(73) Assignee: AZ Electronic Materials USA Corp., Somerville, NJ (US)

(*) Notice: Subject to any disclaimer, the term of this patent is extended or adjusted under 35 U.S.C. 154(b) by 377 days.

(21) Appl. No.: 12/978,740

(22) Filed: Dec. 27, 2010

(65) Prior Publication Data
US 2012/0160801 A1 Jun. 28, 2012

(51) Int. Cl.
*C08L 83/16* (2006.01)
(52) U.S. Cl.
USPC .......................................... 525/477; 525/478
(58) Field of Classification Search
None
See application file for complete search history.

(56) References Cited

U.S. PATENT DOCUMENTS

| | | | |
|---|---|---|---|
| 5,292,830 A * | 3/1994 | Funayama et al. | 525/478 |
| 8,501,394 B2 | 8/2013 | Takano et al. | |
| 2007/0196672 A1* | 8/2007 | Brand et al. | 428/447 |
| 2010/0159255 A1* | 6/2010 | Lee et al. | 428/447 |

FOREIGN PATENT DOCUMENTS

| | | | |
|---|---|---|---|
| JP | 6-166580 | * | 6/1994 |
| WO | WO 2009/096371 A1 | | 6/2009 |

OTHER PUBLICATIONS

Machine-generated translation of JP 6-166580 into English.*
abstract for JP 2002-248713 (Sep. 2002).*

* cited by examiner

*Primary Examiner* — Marc Zimmer
(74) *Attorney, Agent, or Firm* — Sangya Jain

(57) ABSTRACT

There are provided a composition for forming a superfine pattern and a method employing the same for forming a superfine pattern. The composition enables to simply produce a superfine pattern with high mass productivity.
The composition comprises perhydropolysilazane (I), silicon-containing polymer (II) having a hydrocarbon group, and a solvent. The mixture of those polymers contains silicon-hydrogen bonds and silicon-hydrocarbon group bonds in such amounts that the number of the silicon-hydrocarbon group bonds is in a ratio of 1 to 44% based on the total number of the silicon-hydrogen bonds and the silicon-hydrocarbon group bonds. The composition is applied on a resist pattern to form a spacer formed of the composition on the side wall of the ridges in the pattern, and then the spacer or a resin layer disposed around the spacer is used as a mask to form a superfine pattern.

8 Claims, 2 Drawing Sheets

SUPERFINE PATTERN MASK, METHOD FOR PRODUCTION THEREOF, AND METHOD EMPLOYING THE SAME FOR FORMING SUPERFINE PATTERN

TECHNICAL FIELD

This invention provides a method for forming a pattern, particularly a method for forming a pattern on a base material in the production of semiconductor devices. The present invention also provides a method for forming a pattern mask used in the pattern formation.

BACKGROUND ART

In a process of producing a semiconductor device, a film to be treated (for example, an insulating film or an electroconductive film) is generally formed on a base material. Subsequently, an etching mask is formed on the film, and a pattern having predetermined dimension and shape is formed by etching in the film to be treated. The above procedure is repeated a plurality of times.

In the step of forming a pattern in the film to be treated, a lithography technique is generally used in which the so-called exposure step, development treatment step and the like are carried out using a photosensitive material called a photoresist (hereinafter referred to simply as "resist").

When the lithography technique is used, a pattern of the film to be treated is generally formed according to the following procedure. Specifically, a resist film is formed by coating on a film to be treated, and the resist film in its predetermined region is exposed imagewise through an exposure mask (reticle). Next, the resist film after the exposure is developed, and the exposed or unexposed part is removed to form a resist pattern. A pattern of the film to be treated is then formed, for example, by drying etching using this resist pattern as a mask.

In recent years, when a resist film is exposed, short wavelength exposure light should be used, for example, from the viewpoints of improved resolution and throughput. For example, light sources which emit ultraviolet light, such as, KrF excimer laser and ArF excimer laser, are used so as to obtain such a fine pattern as has a line width of about 90 nm. Further, according to the liquid immersion lithography, the line width can be more decreased to about 40 nm.

However, it is difficult to further miniaturize a pattern only by improving the light source and/or method of exposure, and hence novel pattern formation methods are being studied. For example, Patent document 1 discloses a method comprising the steps of: forming a first relief pattern on a film to be treated; coating side walls of ridges in the relief pattern to form a spacer made of polysilazane-containing resin composition; and forming a superfine pattern by use of the spacer or the resin layer around there as a mask. This method (hereinafter, often referred to as "double patterning" for simplification) enables to reduce the line width to about 20 nm.

[Patent document 1] International Patent Publication No. 2009/96371 Pamphlet

DISCLOSURE OF INVENTION

Problem to be Solved by the Invention

The present inventors have researched and found the method disclosed in Patent document 1 is characterized in that the spacer is formed relatively rapidly. This characteristic is favorable from the viewpoint of manufacturing speed of the products, but often makes it difficult to control the thickness of the spacer if the spacer is formed too rapidly. Further, the formation speed of the spacer is liable to depend on the temperature in a relatively large degree. Accordingly, for the purpose of increasing the allowance of production conditions, namely, for enlarging the process margin, there is room for improvement on the formation speed of the spacer and the temperature dependence thereof.

Means for Solving Problem

A composition of the present invention for forming a superfine pattern is characterized by comprising
perhydropolysilazane (I),
silicon-containing polymer (II) having a hydrocarbon group, and
a solvent which dissolves said perhydropolysilazane (I) and said silicon-containing polymer (II) but which does not dissolve a resist pattern; wherein
the mixture of said perhydropolysilazane (I) and said silicon-containing polymer (II) contains silicon-hydrogen bonds and silicon-hydrocarbon group bonds in such amounts that the number of the silicon-hydrocarbon group bonds is in a ratio of 1 to 44% based on the total number of the silicon-hydrogen bonds and the silicon-hydrocarbon group bonds.

A method of the present invention for forming a superfine pattern mask is characterized by comprising the steps of:
preparing a base material on which a film to be treated is layered;
forming, on the film to be treated, a first relief pattern having ridges;
coating the first relief pattern with the above composition for forming a superfine pattern;
heating the base material after subjected to the coating step, to cure the composition for forming a superfine pattern in a part adjacent to the ridges;
rinsing the base material after subjected to the curing step, to remove an uncured portion of the composition for forming a superfine pattern;
removing the cured composition in a part on the top surface of each ridge, to form on the side wall of each ridge a layer of a material different from the material of the first relief pattern; and
removing the ridges, to form a superfine second relief pattern mask of the different material.

Another method of the present invention for forming a superfine pattern mask is characterized by comprising the steps of:
preparing a base material on which a film to be treated and an intermediate film for treatment assistance are layered in order;
forming, on the intermediate film for treatment assistance, a first relief pattern having ridges;
coating the first relief pattern with the above composition for forming a superfine pattern;
heating the base material after subjected to the coating step, to cure the composition for forming a superfine pattern in a part adjacent to the ridges;
rinsing the base material after subjected to the curing step, to remove an uncured portion of the composition for forming a superfine pattern;
removing the cured composition in a part on the top surface of each ridge, to form on the side wall of each ridge a layer of a material different from the material of the first relief pattern;
removing the ridges of the first relief pattern, to form a superfine second relief pattern of the different material; and etching the intermediate film for treatment assistance through the second relief pattern, to form a superfine pattern mask for fabricating the film to be treated.

Still another method of the present invention for forming a superfine pattern mask is characterized by comprising the steps of:
preparing a base material on which a film to be treated is layered;
forming, on the film to be treated, a first relief pattern having ridges;
coating the first relief pattern with the above composition for forming a superfine pattern;
heating the base material after subjected to the coating step, to cure the composition for forming a superfine pattern in a part adjacent to the ridges;
rinsing the base material after subjected to the curing step, to remove an uncured portion of the composition for forming a superfine pattern;
removing the cured composition in a part on the top surface of each ridge, to form on the side wall of each ridge a layer of a material different from the material of the first relief pattern;
embedding spaces among the ridges with the material substantially same as the material of the first relief pattern, to form a pattern complementary to the first relief pattern; and
removing the layer of the different material, to form a second superfine pattern mask consisting of the first relief pattern and the complementary pattern.

Yet another method of the present invention for forming a superfine pattern mask is characterized by comprising the steps of:
preparing a base material on which a film to be treated and an intermediate film for treatment assistance are layered in order;
forming, on the intermediate film for treatment assistance, a first relief pattern having ridges;
coating the first relief pattern with the above composition for forming a superfine pattern;
heating the base material after subjected to the coating step, to cure the composition for forming a superfine pattern in a part adjacent to the ridges;
rinsing the base material after subjected to the curing step, to remove an uncured portion of the composition for forming a superfine pattern;
removing the cured composition in a part on the top surface of each ridge, to form on the side wall of each ridge a layer of a material different from the material of the first relief pattern;
embedding spaces among the ridges with the material substantially same as the material of the first relief pattern, to form a pattern complementary to the first relief pattern;
removing the layer of the different material, to form a second superfine pattern consisting of the first relief pattern and the complementary pattern; and
etching the intermediate film for treatment assistance through said second pattern, to form a superfine pattern mask for fabricating the film to be treated.

Further, a superfine pattern mask according to the present invention is formed by any one of the above methods.

Furthermore, a method of the present invention for forming a superfine pattern is characterized by comprising the step in which the film to be treated is etched by use of the above superfine pattern mask as an etching mask.

Effect of the Invention

The composition of the present invention for forming a superfine pattern enables to moderate the formation speed of the spacer and the temperature dependence thereof to proper levels in double patterning. As a result, it becomes possible to readily control the thickness of the spacer, to reduce the variation of the pattern width and consequently to improve the production yield.

BEST MODE FOR CARRYING OUT THE INVENTION

Figure 1:
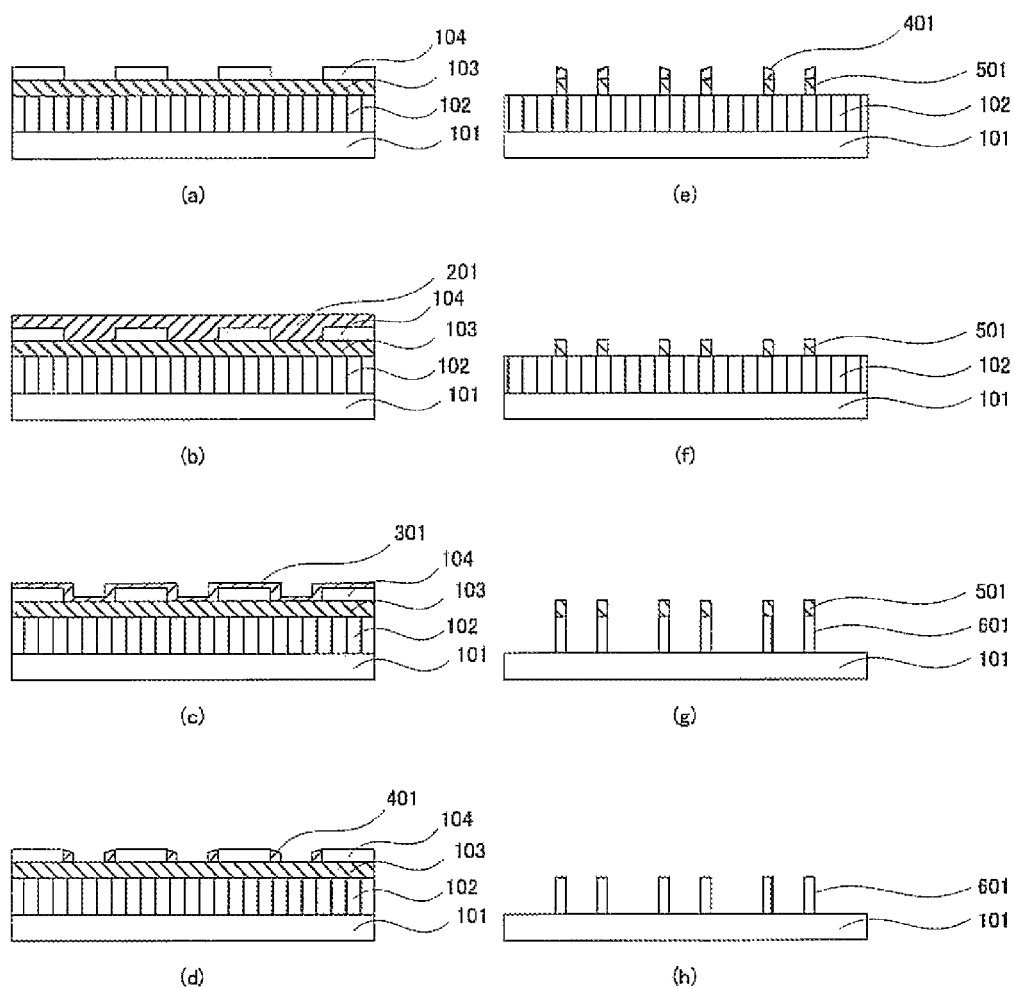
FIG. 1 is a typical diagram illustrating a first embodiment of the method for forming a superfine pattern according to the present invention.

Composition of the Present Invention for Forming a Superfine Pattern

The composition for forming a superfine pattern (hereinafter, often referred to as "resin composition" for simplification) according to the present invention comprises at least two components. One of them is a perhydropolysilazane (I), which comprises atoms of only silicon, nitrogen and hydrogen and which does not comprise other elements. Specifically, the perhydropolysilazane comprises a repeating unit represented by the following formula (Ia):

The perhydropolysilazane in the simplest form comprises a plural number of the repeating units (Ia) linking together in a straight chain having a terminal of —H or —$Si_3H$. However, it may contain a branched-chain repeating unit represented by the following formula (Ib):

The above perhydropolysilazane can have various two-dimensional or three-dimensional structures according to the mixing ratio of the repeating units. For example, it may have a structure represented by the following formula:

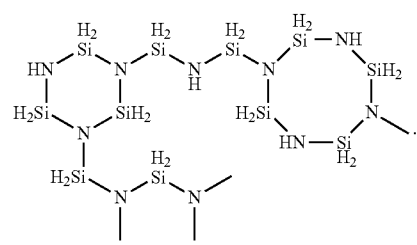

The molecular weight of the perhydropolysilazane is freely selected depending on the kind of the photoresist to use and on the kind of the aimed pattern, but is preferably 500 to 6000, more preferably 1000 to 5000 in terms of weight average molecular weight. In the present specification, the term "weight average molecular weight" means polystyrene-reduced weight average molecular weight measured by gel-permeation chromatography.

The composition according to the present invention for forming a superfine pattern also comprises silicon-containing polymer (II) having a hydrocarbon group. There are various kinds of the silicon-containing polymer, and the present invention can use, for example, a derivative of polymer having a silicon-containing main chain, such as a derivative of polysiloxane, polysilazane or polysilsesquioxane, modified with a hydrocarbon group connecting to the main chain. Further, it is also possible to use a derivative modified with a silane or disilane group connecting to a hydrocarbon chain. However, since the silicon-containing polymer as well as the above perhydropolysilazane serves as material for forming a pattern, it needs to contain silicon in a relatively large amount. Accordingly, the derivative of polymer having a silicon-containing main chain is preferably adopted. Examples of the hydrocarbon group include an alkyl group, a cycloalkyl group, an aryl group, and their derivative hydrocarbon groups in which hydrogen atoms are fully or partly replaced with amino groups, alkoxyl groups, acetoxyl groups, fluorine atoms or the like. The hydrocarbon group may contain an unsaturated bond. Further, the silicon-containing polymer may have a straight-chain or branched-chain structure.

Preferred examples of the silicon-containing polymer include a polysiloxane derivative, a polysilazane derivative and a polysilsesquioxane derivative. They are described below in detail.

One preferred example of the silicon-containing polymer (II) is a polysiloxane derivative comprising a repeating unit represented by the following formula (IIa):

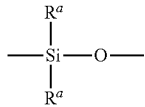

(IIa)

in which each $R^a$ may be the same or different from each other and is selected from the group consisting of hydrogen, an alkyl group having 1 to 6 carbon atoms, a fully or partly fluorinated alkyl group having 1 to 6 carbon atoms, a cycloalkyl group having 5 to 7 carbon atoms, an aryl group having 6 to 10 carbon atoms, an alkylamino group having 1 to 6 carbon atoms and an alkoxy group having 1 to 6 carbon atoms.

In the above formula, all the $R^a$s contained in the above polysiloxane derivative are not hydrogen atoms at the same time. This means that at least one of the hydrogen atoms connecting to the silicon atom must be replaced with the hydrocarbon group.

The polysiloxane derivative used in the present invention has a weight average molecular weight of preferably 500 to 6000, more preferably 1000 to 4000.

Another preferred example of the silicon-containing polymer (II) is a polysilazane derivative comprising a repeating unit represented by the following formula (IIb):

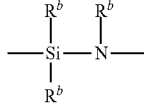

(IIb)

in which each $R^b$ may be the same or different from each other and is selected from the group consisting of hydrogen and an alkyl group having 1 to 6 carbon atoms.

In the above formula, all the $R^b$s contained in the above repeating unit are not hydrogen atoms at the same time, and hence at least one of the hydrogen atoms connecting to the silicon atom must be replaced with the hydrocarbon group. Like the perhydropolysilazane described above, the polysilazane derivative is also capable of having a branched-chain structure or a two-dimensional or three-dimensional structure.

The polysilazane derivative used in the present invention has a weight average molecular weight of preferably 650 to 6000, more preferably 1200 to 3800.

Still another preferred example of the silicon-containing polymer (II) is a polysilsesquioxane derivative comprising a repeating unit represented by the following formula (IIc):

$$[R^c SiO_{1.5}]$$ (IIc)

in which $R^c$ is selected from the group consisting of hydrogen, an alkyl group having 1 to 6 carbon atoms, a cycloalkyl group having 5 to 7 carbon atoms, an aryl group having 6 to 10 carbon atoms, an alkylamino group having 1 to 6 carbon atoms and an alkoxy group having 1 to 6 carbon atoms.

In the above, all the $R^c$s contained in the repeating unit are not hydrogen atoms at the same time, and hence at least one of the hydrogen atoms connecting to the silicon atoms must be replaced with the hydrocarbon group. In a molecule of polysilsesquioxane, each silicon atom connects to another silicon atom via an oxygen atom. Accordingly, the polysilsesquioxane derivative can have various structures such as a cage structure and a dendrimer structure, but the present invention can use the polysilsesquioxane derivative in any structure.

The polysilsesquioxane derivative used in the present invention has a weight average molecular weight of preferably 1000 to 8000, more preferably 2000 to 5300.

The composition of the present invention for forming a superfine pattern is a solution in which the perhydropolysilazane (I) and the silicon-containing polymer (II) are dissolved in a solvent described below. In the present invention, the mixing ratio between the perhydropolysilazane (I) and the silicon-containing polymer (II) is regulated in terms of the ratio of how many silicon-hydrogen bonds in the mixture thereof are substituted with silicon-hydrocarbon group bonds, namely, in terms of the ratio of the number of the silicon-hydrocarbon group bonds based on the total number of the silicon-hydrogen bonds and the silicon-hydrocarbon group bonds. (Hereinafter, this ratio is often referred to as "substitution ratio".) Specifically, the substitution ratio is indispensably 1 to 44%, preferably 2 to 32%. This is because the substitution ratio affects formation speed of the spacer and the temperature dependence thereof described later. If the substitution ratio is within a particular range, the spacer width can be so ensured and the thickness of the spacer can be easily so controlled that the resultant products can be prevented from unevenness.

The perhydropolysilazane (I) and the silicon-containing polymer (II) are preferably so mixed that the amount of the silicon-containing polymer (II) may be in a weight ratio of 0.05 to 1 based on the weight of the perhydropolysilazane (I). However, since depending on the substitution ratio of the silicon-containing polymer, the preferred weight ratio is not absolutely in the above range. The optimal range of the weight ratio changes according to the kind of the silicon-containing polymer. Specifically, the weight ratio is in the range of 0.05 to 1, preferably 0.05 to 0.25 if the polysiloxane derivative is used; in the range of 0.05 to 9, preferably 0.1 to 2.4 if the polysilazane derivative is used; or in the range of 0.05 to 2.6, preferably 0.1 to 0.43 if the polysilsesquioxane derivative is used. Each of those weight ratios is based on the weight of the perhydropolysilazane (I).

The composition used in the present invention for forming a superfine pattern generally comprises a solvent. The solvent should dissolve the perhydropolysilazane (I) and the silicon-containing polymer (II). This is because the composition is preferably homogeneous in coating on the formed resist pattern. Accordingly, it is enough for the polymers to have such solubility in the solvent that the composition may be homogeneous. On the other hand, if the formed pattern is made of an organic resist, there is fear that the solvent may dissolve and destroy the resist pattern before miniaturized when the composition is coated thereon. It is, therefore, necessary for the solvent not to dissolve the resist pattern. Further, the solvent preferably does not react with the above polymers.

The solvent used in the present invention may be any solvent so far as it satisfies the above requirement. Further, the solvent may be selected depending, for example, upon the type of resin used and resist material applied. Such solvents include (a) ethers, for example, dibutyl ether (DBE), dipropyl ether, diethyl ether, methyl-t-butyl ether (MTBE), and anisole, (b) saturated hydrocarbons, for example, decalin, n-pentane, 1-pentane, n-hexane, i-hexane, n-heptane, i-heptane, n-octane, i-octane, n-nonane, i-nonane, n-decane, i-decane, ethylcyclohexane, methylcyclohexane, cyclohexane, and p-menthane, (c) unsaturated hydrocarbons, for example, cyclohexene, and dipentene (limonene), (d) ketones, for example, methy isobutyl ketone (MIBK), and (e) aromatic hydrocarbons, for example, benzene, toluene, xylene, ethyl benzene, diethyl benzene, trimethyl benzene, and triethyl benzene. Among them, solvents selected from the group consisting of (a) ethers and (b) saturated hydrocarbons are preferred. More specifically, dibutyl ether and decaline are preferred solvents. That is because, even when the type of the resin and resist material varies, they can be extensively applied. These solvents may if necessary be used in a combination of two or more of them.

In the composition of the present invention for forming a superfine pattern, the concentration of the polymers is not particularly limited. However, the concentration can be properly regulated depending on the coatability of the composition onto the surface of the resist pattern and on the thickness of the desired pattern-covering cured layer. In general, the content of the perhydropolysilazane is preferably 0.5 to 10%, more preferably 1.0 to 9.0%, based on the total weight of the composition. The content of the silicon-containing polymer (II) depends on the content of the perhydropolysilazane and on the substitution ratio. However, in general, the total content of the perhydropolysilazane and the silicon-containing polymer (II) is preferably 0.525 to 10%, more preferably 2.0 to 9.8%.

The resin composition according to the present invention may if necessary comprise other additives. Such additives include surface active agents, leveling agents, and plasticizers. The content of those additives is not more than 0.4% based on the total weight of the composition.

The composition of the present invention for forming a superfine pattern preferably contains water in a particularly small amount. This is for the purpose of avoiding an unexpected reaction because the perhydropolysilazane is liable to react with water. Specifically, the water content is preferably 2 ppm or below based on the total weight of the composition. Further, in preparing the composition for forming a superfine pattern, the perhydropolysilazane (I) and the silicon-containing polymer (II) are preferably controlled to contain water in a small amount. Specifically, the water content in the perhydropolysilazane (I) and the silicon-containing polymer (II) is preferably 20 ppm or below based on the total weight thereof.

First Method for Forming a Superfine Pattern

The first embodiment of the present invention will be described with reference to FIGS. 1 (a) to (h). FIGS. 1 (a) to (h) are cross-sectional views of respective patterns in a direction perpendicular to the longitudinal direction.

A film 102 to be treated into a resultant pattern is first formed on a base material 101, for example, on a silicon substrate or on a glass substrate. In this case, an intermediate film for pre-treatment (not shown) may be previously provided on a surface of the base material to improve the adhesion of the film 102 to be treated, to improve the planarity of the substrate, and to improve the processability in etching treatment and the like. The film 102 to be treated may be thus formed on the base material 101 through the intermediate film for pre-treatment. If made of some particular substances, the base material can function not only as a support but also as the film to be treated. This means that the surface of the base material can serve as the film to be treated and hence can be fabricated by use of a pattern mask described later.

In the present invention, the film 102 to be treated into a resultant pattern may be formed of any material according to the contemplated purpose without particular limitation. Examples of materials for the film to be treated include (a) electroconductive materials, for example, aluminum (Al), aluminum silicide (AlSi), copper (Cu), tungsten (W), tungsten silicide (WSi), titanium (Ti), or titanium nitride (TiN), (b) semiconductor materials, for example, germanium (Ge) or silicon (Si), or (c) insulating materials, for example, silicon oxide (SiO), silicon nitride (SiN), silicon oxide nitride (SiON), or organic materials such as organic resins.

These materials are selected depending upon the contemplated pattern. Specifically, the film to be treated is directly fabricated into the pattern incorporated, for example, in final semiconductor devices. For example, the film is fabricated into a metal wiring layer or an interlayer insulating film, and accordingly a material suitable for its function is selected. For example, when the pattern is utilized as a trench isolation structure or a low dielectric insulating film, an inorganic or organic insulating material is used. On the other hand, when a wiring structure is formed, an electroconductive material is used. Organic materials usable herein include, for example, novolak, polyvinyl phenol, polymethacrylate, polyarylene, polyimide, and polyarylene ether materials and organic materials containing carbon atoms such as carbon.

If necessary, an intermediate film 103 for treatment assistance is formed on the film 102 to be treated. The following mainly explains the case where the intermediate film for treatment assistance is formed. As for the case where the intermediate film is not formed, the description of the intermediate film in the following can be applied to the film to be treated. That is because the present invention is characterized by forming a superfine pattern mask directly on the film to be treated or, if formed, on the intermediate film, and therefore it essentially gives no difference to the formation of the mask itself whether the film to be treated or the intermediate film is fabricated by use of the mask.

If formed, the intermediate film for treatment assistance may be the same as or different from the aforementioned intermediate film for pre-treatment, which may be provided on the base material 101. The intermediate film for treatment assistance may be made of materials for conventional anti-reflection layers, so as to function as an anti-reflection layer. Further, the intermediate film for treatment assistance may serve as the lower resist layer in a multilayer resist method. In that case, the intermediate film is made of, for example, novolak, polyvinyl phenol, polymethacrylate, polyarylene, polyimide, polyarylene ether materials, and organic materials containing carbon atoms such as carbon.

When an organic material is used as the material for the intermediate film for treatment assistance, the content of carbon in the organic material is preferably not less than 10% by weight. The reason for this is that, when the carbon content is not less than 10% by weight, in the etching process, the etching selection ratio between the film and a layer formed of a resin composition described later, in other words, the etching rate difference, is increased, so as to contribute to easy processing. The thickness of the intermediate film for treatment assistance varies depending upon applications and preferably generally falls within the range of 20 to 10000 nm. The reason for this is that, when the thickness of the film is not more than 20 nm, a contemplated final pattern derived from the intermediate film for treatment assistance cannot be sometimes provided. When the thickness of the film is not less than 10000 nm, the occurrence of the processing conversion difference is significant in the process of transferring a spacer pattern, which will be described later, onto the film to be treated.

Further, according to the kinds of the film to be treated and the intermediate film for treatment assistance and also to the etching conditions, it is possible to stack a plural number of the intermediate films for treatment assistance. Particularly when formed on the film 102 to be treated, the intermediate film 103 for treatment assistance is preferably made of such material that the intermediate film can be etched through a mask, which is a spacer formed from the later-described resin composition, and then that the thus-etched film can play the role of a mask when the underlying film to be treated is etched in the subsequent procedure. In this case, the mask of the etched film is itself regarded as a superfine pattern mask. The film to be treated is not necessarily formed on the base material, and the intermediate film 103 for treatment assistance may be directly formed on the surface of the base material and fabricated to be a superfine pattern that serves as a mask for fabricating the base material surface serving as the film to be treated.

A first relief pattern 104 having ridges is formed on the film 102 to be treated either through an intermediate film 103 for treatment assistance when the intermediate film 103 is present, or directly on the film 102 when the intermediate film 103 is absent (FIG. 1 (*a*)). Specifically, the resist pattern 104 can be formed by coating a resist (for example, a positive-working chemical amplification resist) composition or the like and then by exposing and developing the coating according to a conventional method. However, this by no means restricts the process of forming the relief pattern 104, which can be formed in other manners. For example, a layer is prepared from materials other than the resist composition, and is then fabricated by lithography or the like to form the relief pattern 104.

A resin composition usable for the formation of the resist pattern 104 may be any conventional radiation-sensitive resin composition. Radiation-sensitive resin compositions include, for example, positive-working resists containing alkali soluble resins such as novolak resins, hydroxystyrene resins, or acrylic resins, and quinonediazide compounds, and chemical amplification-type positive or negative working resists which, upon light irradiation, generate an acid of which the catalytic action is utilized to form a resist pattern. Preferred are chemical amplification-type positive working resists which, upon light irradiation, generate an acid of which the catalytic action is utilized to form a resist pattern. A number of resist materials have been proposed and are commercially available, and any conventional resist material may be used. The resist pattern may be formed from a radiation-sensitive resin composition by use of any conventional techniques concerning, for example, a coating method, an exposure method, a baking method, a development method, a developing agent, or a rinsing method.

In order to form a final superfine pattern, the fineness of the first relief pattern is preferably made higher. To this end, for example, it is preferred to adopt a method for forming a superfine pattern using ArF or KrF as an exposure light source.

The thickness of the first relief pattern corresponds to the thickness of a spacer described later. For example, when the thickness of the intermediate film 103 for treatment assistance is in the range of 20 to 10000 nm, the thickness of a spacer 401 described later is preferably in the range of 20 to 5000 nm. Accordingly, the thickness of the first relief pattern should be similar thereto. The reason for this is that, if the thickness of the spacer 401 is smaller than 20 nm, the spacer 401 as the mask is disadvantageously consumed in the process of etching the intermediate film 103 for treatment assistance and accordingly it is difficult to process the intermediate film 103 for treatment assistance into predetermined dimension and shape. On the other hand, if the thickness of the first relief pattern 104 is reduced, it becomes possible to improve the exposure allowance, focus allowance and resolution in the exposure. When the thickness of the spacer part 401 is larger than 5000 nm, caution is required because it becomes difficult to resolve the resist pattern itself as the first relief pattern and to embed the resin composition itself.

Next, as shown in FIG. 1 (*b*), the resin composition is coated so as to cover the first relief pattern 104 to form a covering layer 201. This resin composition is the aforementioned composition for forming a superfine pattern.

The resin composition may be coated for forming the covering layer 201, for example, by conventional methods used in coating the radiation-sensitive resin composition, and examples of suitable methods include spin coating, spray coating, dip coating, and roller coating. The coated covering layer is subsequently heated to cure the resin composition in a part near the first relief pattern.

The resin composition layer is heated, for example, under conditions of a temperature of 60 to 250° C., preferably 80 to 170° C., and a heating time of 10 to 300 sec, preferably about 60 to 120 sec. The temperature is preferably a temperature at which intermixing of the resist pattern with the resin composition layer takes place. The thickness of the resin composition layer formed may be properly regulated, for example, by the temperature and time of the heat treatment, the radiation-sensitive resin composition used, and the water-soluble resin composition. Accordingly, these various conditions may be determined based on the necessary level of fineness of the resist pattern, in other words, a necessary increase in width of the resist pattern. The thickness of the covering layer, however, is generally 0.01 to 100 µm in terms of thickness as determined from the surface of the resist pattern.

Thus, upon heating of the whole substrate, a curing reaction of the covering layer 201 takes place near ridges of the first relief pattern. Thereafter, a pattern provided by fining the first relief pattern covered with the cured layer 301 can be obtained by rinsing the substrate with a solvent to remove the uncured resin composition (FIG. 1 (*c*)).

A solvent, which cannot significantly dissolve the cured layer and can significantly dissolve the resin composition, is selected as the solvent for the rinsing treatment which, upon heating, can allow only the formed cured layer 301 to stay and can remove the resin composition in its part remaining unreacted. The solvent used in the resin composition is more preferably used in the rinsing treatment.

Next, the cured layer formed on the first relief pattern is processed to form a layer, formed of a material dissimilar to the material constituting the first relief pattern, on the side wall of the ridges of the first relief pattern. This layer is hereinafter referred to as "spacer" for convenience. In order to form this spacer, the cured layer covering the top surface of the first relief pattern should be selectively removed. In this case, the selective etching method is not particularly limited so far as the spacer can be finally formed. Examples of selective etching methods include wet etching methods after protecting the side wall part of the cured layer with any embedding agent, or dry etching methods, for example, reactive ion etching, magnetron-type reactive ion etching, electron beam ion etching, ICP etching, or ECR ion etching. As described above, the cured layer is formed of a compound comprising silicon as a central element and other elements. Accordingly, when the dry etching method is used, it is preferred to use a source gas containing a fluorine atom (F).

The embedded bottom where neither the relief pattern nor the spacer is formed, that is, the surface of the intermediate film 103 for treatment assistance if provided or of the film 102 to be treated if the intermediate film is not provided, may be also covered with the cured layer. If the method of coating the resin composition and/or the curing condition is properly controlled, it is possible not to form the cured layer on the embedded bottom. However, the cured layer is normally formed on the embedded bottom. In this case, that must be removed. It is easy and preferred that the cured layer both on the embedded bottom and on the top surface of the relief pattern be removed at the same time. The etching condition is so controlled as to simultaneously remove the cured layer both on the embedded bottom and on the top surface of the relief pattern. However, the cured layer on the embedded bottom may be removed in any step before the film to be treated is etched by use of the superfine pattern as a mask. Specifically, it may be carried out before the cured layer on the top surface of the relief pattern is removed or otherwise simultaneously with the later-described removal of the first relief pattern. Nevertheless, if the intermediate film 103 for treatment assistance is provided, it is necessary to remove the cured layer before the intermediate film is etched.

The above processing forms a layer (spacer) 401 formed of a material dissimilar to the material constituting the first relief pattern on the side wall of the ridges of the first relief pattern and thus to form a second relief pattern (FIG. 1 (d)).

Next, the first relief pattern 104 is removed by a dry etching method (not shown) to form a mask layer composed of only the spacer 401, and then the intermediate layer 103 for treatment assistance (or the film to be treated, if the intermediate layer is not provided) in its part not covered by the spacer 401 is removed by etching. That is, the intermediate film 103 for treatment assistance is etched using the second relief pattern composed of the spacer 401 as a mask to form a pattern 501 derived from the intermediate film for treatment assistance (FIG. 1 (e)). Here, the removal of the first relief pattern and that of the intermediate layer 103 for treatment assistance or of the film to be treated can be independently carried out while the etching condition is controlled, or otherwise may be performed successively or simultaneously under the same etching condition. If the etching condition is so controlled that only the first relief pattern is removed to complete the treatment, a mask layer composed of only the spacer 401 can be obtained. If the initially formed first relief pattern 104 is a line-and-space pattern, a spacer is formed as a line pattern in the pattern 501 on both sides of each line. Accordingly, as for the number of lines, the formed lines are twice as many as those formed by the conventional method. Therefore, this method can also be called a pattern doubling method.

Prior to etching for forming the pattern 501, for example, a resin is preferably embedded in a space among the ridges in the first relief pattern. Specifically, in the etching treatment, sides of each ridge in the second relief pattern are exposed, and hence the width of ridge is sometimes reduced by etching effect. Accordingly, the second relief pattern is preferably protected by resin embedding. The resin may be arbitrarily selected from various resins but is preferably an organic material having an etching selection ratio equal to that of the first relief pattern. Examples of such organic materials include solutions of polyvinyl-pyrrolidone-hydroxyethyl acrylate or the like dissolved in solvents.

In this case, the dry etching method is not particularly limited so far as the intermediate film 103 for treatment assistance can be processed. The method can be properly selected from known processes capable of micro-fabrication. Examples of the processes include reactive ion etching, magnetron-type reactive ion etching, electron beam ion etching, ICP etching, or ECR ion etching. As the source gas, a gas containing at least any one atom selected from the group consisting of an oxygen atom (O), a nitrogen atom (N), a chlorine atom (Cl), and a bromine atom (Br) is preferably used. To an enchant provided by discharge in the above atom-containing gas, a compound containing a bond between an inorganic element and oxygen is inert enough to act advantageously on the space.

Accordingly, the intermediate film 103 for treatment assistance can be etched with good anisotropy. Oxygen atom-containing etching gases include $O_2$, CO, and $CO_2$. Nitrogen atom-containing etching gases include $N_2$ and $NH_3$. Chlorine atom-containing etching gases include $Cl_2$, HCl and $BCl_3$. Bromine atom-containing etching gases include HBr and $Br_2$. These etching gases may be used as a mixture of two or more. Further, the etching gas may contain a sulfur atom (S). The reason for this is that the film to be treated can be processed with good anisotropy. In addition to the above gas, gases such as argon (Ar) or helium (He) may be contained.

After the formation of the pattern 501, the spacer 401 which stays on the pattern 501 is if necessary removed (FIG. 1 (f)). Thus, a superfine pattern usable as a mask for film 102 processing is formed. If the intermediate film 103 for treatment assistance is not provided, the film to be treated is processed to form a superfine pattern. In this case, for example, wet etching methods or dry etching methods, such as, reactive ion etching, magnetron-type reactive ion etching, electron beam ion etching, ICP etching and ECR ion etching, may be used. As described above, in the cured layer, silicon constitutes a central atom and forms a compound with other elements. Accordingly, when the dry etching method is used, it is preferred to use a source gas containing a fluorine atom (F). However, since the film 102 to be treated is exposed in a space, a method which does not damage the film to be treated should be selected from the above methods.

The film 102 is then treated using this pattern 501 as an etching mask. A wet etching method or a dry etching method may be used for treating the film. More specific examples of such methods include dry etching methods, for example, reactive ion etching, magnetron-type reactive ion etching, electron beam ion etching, ICP etching and ECR ion etching. In general, an etchant is selected depending upon the material for the film to be treated.

The film to be treated is thus processed to form a superfine pattern 601 (FIG. 1 (g)), and then, if necessary, the pattern 501 which stays as the mask is removed (FIG. 1 (h)).

The method described above comprises the steps of: preparing a base material comprising a film to be treated and an intermediate film for treatment assistance provided on a substrate, providing a superfine pattern formed directly thereon, and forming an aimed superfine pattern by use of the superfine pattern as a mask. The present invention, however, is not limited to this method only. Alternative methods usable herein include: a method comprising the steps of forming an intermediate film 103 for treatment assistance on a transparent substrate such as a bare glass substrate to form a base material, treating the base material by the method according to the present invention to form an independent superfine pattern mask, bringing the superfine pattern mask into intimate contact with a resist film provided on an independently provided insulating material film or an electroconductive material film to form an assembly, and exposing the assembly to light, that is, subjecting the assembly to contact exposure to form a pattern; and a method comprising the steps of transferring a superfine pattern mask formed according to the above method on the base material onto an independently provided insulating material film or an electroconductive material film, and subjecting the assembly to etching through the pattern mask to form a pattern. The pattern formed according to the present invention may be used as a pattern mask for use in a next step.

Second Method for Forming a Superfine Pattern

In the first method for forming a superfine pattern, the pattern is formed using the spacer formed on the side wall of the ridges of the first relief pattern as a mask. On the other hand, in the second method for forming a superfine pattern, the pattern is formed by removing the spacer and the layer underlying the spacer. The second embodiment of the present invention will be described in detail with reference to FIGS. 2 (a) to (h).

Figure 2:
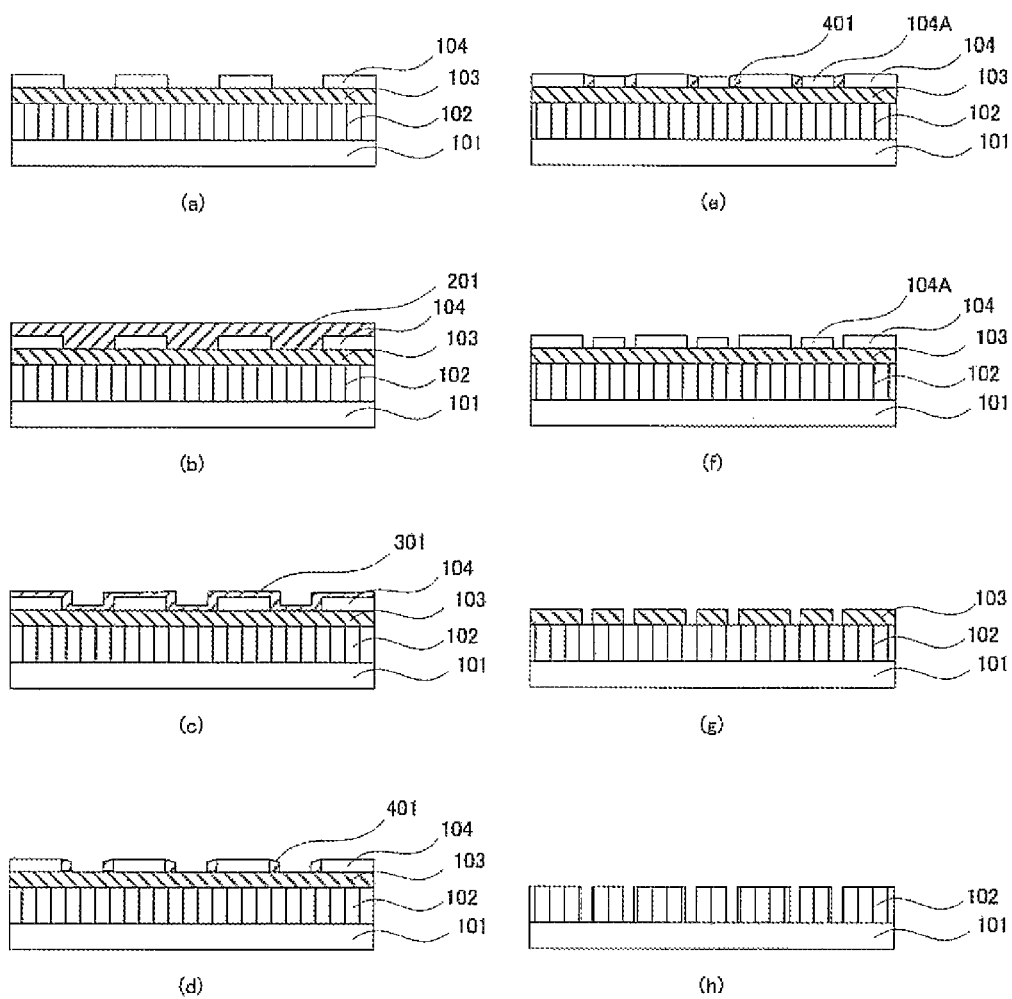
FIG. 2 is a typical diagram illustrating a second embodiment of the method for forming a superfine pattern according to the present invention.

At the outset, in the same manner as the first method for forming a superfine pattern, the spacer is formed on the side wall of the ridges of the first relief pattern (FIGS. 2 (a) to (d)). Steps up to this stage are the same as those in the first method for forming a superfine pattern.

A material 104A which is equivalent to the first relief pattern is embedded in the space part among the ridges of the first relief pattern (FIG. 2 (e)). The space part among the ridges of the first relief pattern has been fined by the spacer 401, and consequently the space among the spacer substantially constitutes the space part.

The material embedded in the space part among the ridges of the first relief pattern is equivalent to the material for the first relief pattern, and is preferably the same as the material used in the formation of the first pattern. For example, when the first relief pattern has been formed using a resist resin or the like, the space part is preferably filled with the resist composition used for the formation of the first relief pattern and then the composition is cured. In this connection, it should be noted that the material embedded in the space part constitutes a pattern complementary to the first relief pattern later. In other words, the material embedded in the space part forms additional ridges complementing the first relief pattern. Specifically, in forming a final superfine pattern, the material should function as the same mask material as in the first relief pattern. Accordingly, the material equivalent to the material constituting the first relief pattern is not necessarily identical to the material used in the formation of the first relief pattern, and may be any material that functions as the mask material in the same manner as that of the first relief pattern and further that can be etched and removed in the same manner as that of the first relief pattern.

The thickness of the material layer is preferably the same as the thickness of the first relief pattern so that the material layer embedded in the space can function as the mask material for forming a final superfine pattern. To this end, the material layer is preferably embedded to the same height as the first relief pattern. Alternatively, a method may also be adopted in which, after the material layer is embedded to a larger height than the height of the first relief pattern, the assembly is then flattened, for example, by etching treatment to the same height as the first relief pattern. In FIG. 2 (e), the height of the embedded material 104A is shown as different from the height of the first relief pattern 104 for distinguishing the embedded material 104A from the first relief pattern 104. Preferably, however, the height difference is small.

Subsequently, the spacer 401 is removed by the same method as described above in connection with the first method for forming a superfine pattern (FIG. 2 (f)). Thus, a pattern serving as a mask for etching the film 102 to be treated or the intermediate film 103 for treatment assistance is formed. This pattern comprises a first relief pattern 104 and a pattern 104A complementary to the first relief pattern 104.

The intermediate film 103 for treatment assistance is treated using, as a mask, a pattern formed of the first relief pattern 104 and the pattern 104A complementary to the first relief pattern 104 (FIG. 2 (g)) to form a superfine pattern for treating the film 102 to be treated. The film 102 to be treated is then treated using the patterned intermediate layer 103 for treatment assistance as a mask (FIG. 2 (h)). Thus, a second superfine pattern having grooves corresponding to the spacer 401 can be formed.

As described above, in the method for forming a superfine pattern according to the present invention, the provision of the steps specified in the present invention is indispensable. Further, these steps may be combined with conventional methods. Accordingly, if a resist pattern is adopted in the first relief pattern, any of the conventional photoresists and the conventional resist forming methods may be employed as the photoresist used in the formation of the resist pattern and the resist forming method using the resist pattern, respectively. The resist pattern may be any commonly used resist pattern. On the other hand, regarding the first relief pattern, a relief pattern formed by using a photoresist after the formation of the above superfine pattern as an etching mask for etching the underlying layer is usable.

EXAMPLES

The following various Examples further illustrate the present invention.

Preparation Example 1

In 94.2 g of dibutyl ether, 4.6 g of perhydropolysilazane (weight average molecular weight: 1400) (hereinafter, which is referred to as PHPS) and 1.2 g of methylhydropolysilazane (weight average molecular weight: 1258) (hereinafter, which is referred to as MHPS) were dissolved to prepare a resin composition 1. Here, the "MHPS" is a derivative in which 25% of the hydrogen atoms in perhydropolysilazane are replaced with methyl groups.

Preparation Example 2

In 94.2 g of dibutyl ether, 5.5 g of PHPS and 0.3 g of methylphenylpolysiloxane KF-50™, manufactured by Shin- Etsu Chemical Co., Ltd.) were dissolved to prepare a resin composition 2. Here, the "methylphenylpolysiloxane KF-50" is a derivative in which all the hydrogen atoms in siloxane are replaced with methylphenyl groups.

Preparation Example 3

In 94.2 g of dibutyl ether, 4.3 g of PHPS, 1.2 g of methylhydropoly-silazane MHPS and 0.3 g of methylphenylpolysiloxane KF-54™, manufactured by Shin-Etsu Chemical Co., Ltd.) were dissolved to prepare a resin composition 3.

Preparation Example 4

In 94.3 g of dibutyl ether, 4.0 g of PHPS and 1.7 g of poly-methyl-silsesquioxane-co-phenylsilsesquioxane (weight average molecular weight: 5137) (hereinafter, which is referred to as MPSQ) were dissolved to prepare a resin composition 4. Here, the "MPSQ" is a derivative in which 100% of the hydrogen atoms in polysilsesquioxane are replaced with methyl or phenyl groups.

Preparation Example 5

In 94.2 g of dibutyl ether, 1.6 g of PHPS and 4.2 g of polyphenylsilsesquioxane (weight average molecular weight Mw: 1926) (hereinafter, which is referred to as PSQ) were dissolved to prepare a resin composition 5. Here, the "PSQ" is a derivative in which 100% of the hydrogen atoms in polysilsesquioxane are replaced with methyl or phenyl groups.

Preparation Example 6

In 94.2 g of dibutyl ether, 5.2 g of PHPS and 0.6 g of methylhydropolysilazane HTA1500™, commercially available from Clariant (Japan) K.K.) were dissolved to prepare a resin composition 6. Here, the "methylhydropolysilazane HTA1500" is a derivative in which 50% of the hydrogen atoms in perhydropolysilazane are replaced with methyl groups.

Preparation Example 7

In 94.2 g of dibutyl ether, 2.9 g of PHPS and 2.9 g of methylhydropolysilazane HTA1500™, commercially available from Clariant (Japan) K.K.) were dissolved to prepare a resin composition 7.

Preparation Example 8

In 94.2 g of dibutyl ether, 0.6 g of PHPS and 5.2 g of methylhydropolysilazane HTA1500™, commercially available from Clariant (Japan) K.K.) were dissolved to prepare a resin composition 8.

Preparation Example 9

In 94.2 g of dibutyl ether, 4.06 g of PHPS and 1.74 g of MHPS were dissolved to prepare a resin composition 9.

Preparation Example 10

In 94.2 g of dibutyl ether, 3.48 g of PHPS and 2.32 g of MHPS were dissolved to prepare a resin composition 10.

Preparation Example 11

In 94.2 g of dibutyl ether, 2.9 g of PHPS and 2.9 g of MHPS were dissolved to prepare a resin composition 11.

Preparation Example A

In 94.2 g of dibutyl ether, 5.8 g of PHPS was dissolved to prepare a resin composition A.

Preparation Example B

In 94.2 g of dibutyl ether, 5.8 g of methylhydropolysilazane HTA1500™, commercially available from Clariant (Japan) K.K.) was dissolved to prepare a resin composition B.

Preparation Example C

In 94.2 g of dibutyl ether, 5.8 g of MHPS was dissolved to prepare a resin composition C.

Preparation Example D

In 96.0 g of dibutyl ether, 4.0 g of MPSQ was dissolved to prepare a resin composition D.

Preparation Example E

In 93.0 g of dibutyl ether, 7.0 g of PSQ was dissolved to prepare a resin composition E.

Example 101

A substrate was coated with an ArF resist AX2110P (manufactured by AZ Electronic Materials, 70 Meister Ave., Somerville, N.J., USA), and then exposure and development were carried out in normal manners to produce a developed substrate provided with a line-and-space pattern having a pitch of 1:1.8 and a line width of 50 nm. The procedure was repeated to prepare five developed substrates, each of which was then coated with the resin composition 1. Thereafter, each substrate was subjected to heating treatment for 60 seconds at 150° C., 155° C., 160° C., 165° C. and 170° C. (Example 101). The procedure of Example 101 was repeated except for replacing the resin composition 1 with the resin composition 2, 3 or A, and for changing the heating temperatures, to perform Examples 102, 103 and Comparative Example 101. The heating temperatures in each Example were as follows.

Example 101: 150° C., 155° C., 160° C., 165° C. and 170° C.;

Example 102: 165° C., 170° C., 175° C., 180° C. and 185° C.;

Example 103: 160° C., 165° C., 170° C., 175° C. and 180° C.;

Comparative Example 101: 135° C., 140° C., 145° C., 150° C. and 155° C.

Successively, each substrate was rinsed with dibutyl ether for 20 seconds, and then dried by spinning and further dried by heating at 90° C. for 60 seconds. Before the resin composition was applied and after the substrate was dried, each substrate surface was observed by means of a scanning electron microscope CD-SEM S-9200 [manufactured by Hitachi High-Technologies Corporation] to measure the line width.

The thickness of the covering layer (which corresponds to the spacer) formed on one side-wall of the line ridge can be estimated by the following formula:

Thickness=(line width before treated with resin composition−line width after treated)/2.

On the basis of each spacer thickness obtained above, the spacer thickness was plotted against the heating temperature and thereby regression analysis was carried out to estimate the temperature dependence of the spacer formation speed, which corresponded to the gradient of the regression line. The results were as set forth in Table 1.

TABLE 1

|  | Resin composition | Temperature dependence of spacer formation speed (nm/° C.) |
|---|---|---|
| Com. 101 | A | 0.76 |
| Ex. 101 | 1 | 0.26 |
| Ex. 102 | 2 | 0.28 |
| Ex. 103 | 3 | 0.20 |

Examples 201 to 202 and Comparative Example 201

The procedure of Example 101 was repeated to prepare a developed substrate provided with a line-and-space pattern having a pitch of 1:1.8. The substrate was then coated with the resin composition 4, 5 or A, and then heated at 145° C. for 60 seconds if the resin composition A was applied, at 150° C. for 60 seconds if the composition 4 was applied or at 120° C. for 180 seconds if the composition 5 was applied. Successively, the substrate was rinsed with dibutyl ether for 20 seconds, and then dried by spinning and further dried by heating at 90° C. for 60 seconds. Thereafter, the substrate was subjected to etching treatment by means of Dry Etcher NE5000N (manufactured by ULVAC, Inc.), so that the pattern was doubled according to the first method for forming a superfine pattern.

A cross-section of the doubled pattern was observed by means of a scanning electron microscope S-4700 [manufactured by Hitachi High-Technologies Corporation], to obtain the aspect ratio of the spacer. The "aspect ratio" here was defined by height/width of the spacer. The results were as set forth in Table 2.

TABLE 2

|  | Resin composition | Width of spacer (nm) | Height of spacer (nm) | Aspect ratio |
|---|---|---|---|---|
| Com. 201 | A | 33.7 | 82.0 | 2.4 |
| Ex. 201 | 4 | 26.0 | 98.0 | 3.8 |
| Ex. 202 | 5 | 30.5 | 99.3 | 3.3 |

Examples 301 to 311 and Comparative Examples 301 to 305

The procedure of Example 101 was repeated to prepare a developed substrate provided with a line-and-space pattern having a pitch of 1:1.8. The substrate was then coated with each of the resin compositions 1 to 11 and A to E, and heated under the conditions shown in Table 3. Successively, the substrate was rinsed with dibutyl ether for 20 seconds, and then dried by spinning and further dried by heating at 90° C. for 60 seconds.

The results were as set forth in Table 3.

TABLE 3

|  | Resin composition | Substitution ratio (%) | Heating condition | Width of spacer (nm) |
|---|---|---|---|---|
| Com. 301 | A | 0 | 145° C./60 sec. | 19.2 |
| Com. 302 | B | 50 | 180° C./60 sec. | 6.4 |
| Com. 303 | C | 25 | 180° C./60 sec. | 7.1 |
| Com. 304 | D | 100 | 180° C./60 sec. | 6.2 |
| Com. 305 | E | 100 | 180° C./60 sec. | 6.7 |
| Ex. 301 | 1 | 4 | 160° C./60 sec. | 20.4 |
| Ex. 302 | 2 | 2 | 175° C./60 sec. | 20.8 |
| Ex. 303 | 3 | 7 | 170° C./60 sec. | 20.5 |
| Ex. 304 | 4 | 12 | 150° C./60 sec. | 27.1 |
| Ex. 305 | 5 | 31 | 120° C./180 sec. | 20.3 |
| Ex. 306 | 6 | 4 | 165° C./60 sec. | 21.0 |
| Ex. 307 | 7 | 22 | 170° C./60 sec. | 16.0 |
| Ex. 308 | 6 | 44 | 170° C./60 sec. | 15.0 |
| Ex. 309 | 9 | 7 | 165° C./60 sec. | 22.7 |
| Ex. 310 | 10 | 9 | 170° C./60 sec. | 18.6 |
| Ex. 311 | 11 | 12 | 175° C./60 sec. | 18.3 |

The results shown in Table 3 indicate that a resin composition comprising a mixture of perhydropolysilazane and silicon-containing polymer having a hydrocarbon group enables to form a spacer having no less excellent width than a resin composition comprising perhydropoly-silazane alone. In addition, the aforementioned examples show that, if the composition of the present invention is used, the temperature dependence of spacer formation speed is so small that the formation speed can be easily controlled as compared with the case of adopting the resin composition comprising perhydropolysilazane alone. Therefore, if the present invention is applied to practical manufacturing processes, it becomes possible to prevent the resultant products from unevenness.

The results shown in Table 3 also indicate that a resin composition singly comprising silicon-containing polymer in which some hydrogen atoms are replaced with hydrocarbon groups provides a spacer having insufficient width and hence that it is necessary to use a combination of perhydropolysilazane and silicon-containing polymer having a hydro-carbon group.

Examples 401 to 403 and Comparative Example 401

The procedure of Example 101 was repeated to prepare a developed substrate provided with a line-and-space pattern having a pitch of 1:1.8. The substrate was then coated with the resin composition 1, 2, 4 or A, and then heated at 145° C. for 60 seconds if the resin composition A was applied, at 160° C. for 60 seconds if the composition 1 was applied, at 175° C. for 60 seconds if the composition 2 was applied, or at 150° C. for 60 seconds if the composition 4 was applied. Successively, the substrate was rinsed with dibutyl ether for 20 seconds, and then dried by spinning and further by heating at 90° C. for 60 seconds. Thereafter, the substrate was coated with an ArF resist AX2110P or with an aqueous resist VS-01HJ (manufactured by AZ Electronic Materials K.K., Japan), which had the almost same etching resistance as AX2110P, and then dried by heating at 90° C. for 60 seconds. The substrate was then subjected to etching treatment with 100% fluorine gas by means of Dry Etcher NE5000N (manufactured by ULVAC, Inc.) to remove the spacer derived from each resin composition and thereby to form a doubled pattern.

A cross-section of the doubled pattern was observed by means of a scanning electron microscope CD-SEM S-9200 [manufactured by Hitachi High-Technologies Corporation], to measure the dimension of the formed trench. The results were as set forth in Table 4.

TABLE 4

|  | Resin composition | Trench dimension (nm) |
|---|---|---|
| Com. 401 | A | 23.1 |
| Ex. 401 | 1 | 22.4 |
| Ex. 402 | 2 | 28.3 |
| Ex. 403 | 4 | 21.1 |

The results shown in Table 4 indicate that the present invention enables to form a doubled trench pattern having a trench dimension comparable with a known pattern formed by the conventional method.

DESCRIPTION OF REFERENCE CHARACTERS

| 101 | base material |
| 102 | film to be treated |
| 103 | intermediate film for treatment assistance |
| 104 | first relief pattern |
| 104A | embedding material |
| 201 | covering layer |
| 301 | cured layer |
| 401 | spacer |
| 501 | pattern derived from the intermediate film for treatment assistance |
| 601 | superfine pattern |

The invention claimed is:

1. A composition for forming a superfine pattern, comprising perhydropolysilazane (I), silicon-containing polymer (II) having a hydrocarbon group, and a solvent which dissolves said perhydropolysilazane (I) and said silicon-containing polymer (II) but which does not dissolve a resist pattern; wherein the mixture of said perhydropolysilazane (I) and said silicon-containing polymer (II) contains silicon-hydrogen bonds and silicon-hydrocarbon group bonds in such amounts that the number of the silicon-hydrocarbon group bonds is in a ratio of 1 to 44% based on the total number of the silicon-hydrogen bonds and the silicon-hydrocarbon group bonds and further wherein said silicon-containing polymer (II) is chosen from the group consisting of a) a silicon-containing polymer (II) comprising a repeating unit represented by the following formula (IIa):

(IIa)

in which each $R^a$ may be the same or different from each other and is selected from the group consisting of hydrogen, an alkyl group having 1 to 6 carbon atoms, a fully or partly fluorinated alkyl group having 1 to 6 carbon atoms, a cycloalkyl group having 5 to 7 carbon atoms, an aryl group having 6 to 10 carbon atoms, an alkylamino group having 1 to 6 carbon atoms and an alkoxy group having 1 to 6 carbon atoms, provided that all the $R^a$s contained in said silicon-containing polymer (II) are not hydrogen atoms at the same time and that the weight average molecular weight is in the range of 500 to 6000;

b) a silicon-containing polymer (II) comprising a repeating unit represented by the following formula (IIc):

[$R^cSiO_{1.5}$]  (IIc)

in which $R^c$ is selected from the group consisting of hydrogen, an alkyl group having 1 to 6 carbon atoms, a cycloalkyl group having 5 to 7 carbon atoms, an aryl group having 6 to 10 carbon atoms, an alkylamino group having 1 to 6 carbon atoms and an alkoxy group having 1 to 6 carbon atoms, provided that all the $R^c$s contained in said repeating unit (IIc) are not hydrogen atoms at the same time and that the weight average molecular weight is in the range of 1000 to 8000 and c) a silicon-containing polymer (II) comprising a repeating unit represented by the following formula (IIb):

(IIb)

in which each $R^b$ may be the same or different from each other and is selected from the group consisting of hydrogen and an alkyl group having 1 to 6 carbon atoms, provided that all the $R^b$s contained in said repeating unit (IIb) are not hydrogen atoms at the same time and that the weight average molecular weight is in the range of 650 to 6000 wherein said silicon-containing polymer-comprising a repeating unit represented by the formula (IIb) is methylhydropolysilazane.

2. The composition of claim 1, wherein said perhydropolysilazane has a weight average molecular weight of 500 to 6000.

3. The composition of claim 1, further comprising water in an amount of 2 ppm or less.

4. The composition according to claim 1 for forming a superfine pattern, wherein the total content of the perhydropolysilazane and the silicon-containing polymer (II) in the coating solvent is 0.525 to 10%.

5. The composition according to claim 1 for forming a superfine pattern, wherein the solvent is chosen from the group consisting of ethers, saturated hydrocarbons, unsaturated hydrocarbons, ketones, aromatic hydrocarbons and combinations thereof.

6. The composition according to claim 5 wherein the solvent is chosen from the group consisting of dibutyl ether, dipropyl ether, diethyl ether, methyl-t-butyl ether, anisole, decalin, n-pentane, 1-pentane, n-hexane, i-hexane, n-heptane, i-heptane, n-octane, i-octane, n-nonane, i-nonane, n-decane, i-decane, ethylcyclohexane, methylcyclohexane, cyclohexane, and p-menthane, cyclohexene, dipentene, methyl isobutyl ketone, benzene, toluene, xylene, ethyl benzene, diethyl benzene, trimethyl benzene, triethyl benzene and combinations thereof.

7. The composition according to claim 5 for forming a superfine pattern, wherein the solvent is chosen from the group consisting of ethers and saturated hydrocarbons and combinations thereof.

8. The composition according to claim 1 for forming a superfine pattern, wherein the solvent is chosen from the group consisting of dibutyl ether and decaline and combinations thereof.

* * * * *